United States Patent [19]

Hazanchuk et al.

[11] Patent Number: 5,537,564
[45] Date of Patent: Jul. 16, 1996

[54] TECHNIQUE FOR ACCESSING AND REFRESHING MEMORY LOCATIONS WITHIN ELECTRONIC STORAGE DEVICES WHICH NEED TO BE REFRESHED WITH MINIMUM POWER CONSUMPTION

[75] Inventors: Asher Hazanchuk, San Jose; Aleksander M. Movshovich, Santa Clara, both of Calif.

[73] Assignee: Zilog, Inc., Campbell, Calif.

[21] Appl. No.: 27,666

[22] Filed: Mar. 8, 1993

[51] Int. Cl.⁶ .................................................. G06F 12/00
[52] U.S. Cl. .......................... 395/427; 395/405; 395/166; 365/230.01; 365/230.03; 365/230.08; 365/222
[58] Field of Search .................................. 395/750, 400, 395/425, 427, 431–433, 410, 421.01, 401, 405, 428, 164–166; 365/189.01, 189.04, 230.01, 230.03, 230.06, 230.08, 222; 364/424.04, 424.06, 251.2

[56] References Cited

U.S. PATENT DOCUMENTS

| 4,432,055 | 2/1984 | Salas et al. | 364/200 |
| 4,602,275 | 7/1986 | Smith et al. | 358/11 |
| 4,967,397 | 10/1990 | Walck | 365/222 |
| 5,148,546 | 9/1992 | Blodgett | 395/750 |
| 5,357,606 | 10/1994 | Adams | 395/164 |

*Primary Examiner*—Kee Mei Tung
*Attorney, Agent, or Firm*—Majestic, Parsons, Siebert & Hsue

[57] ABSTRACT

A technique for accessing and refreshing memory locations within a plurality of electronic storage devices which need to be refreshed is disclosed. The technique allows for the accessing of memory locations within the plurality of devices row-by-row such that all memory locations having the same row address within each of the devices are accessed before a memory location with a higher row address is accessed. This accessing technique is implemented through the use of a newly designed address decoder architecture. Once data is stored within the memory locations in this manner, the refreshing technique refreshes only those rows within the plurality of devices which contain data.

14 Claims, 4 Drawing Sheets

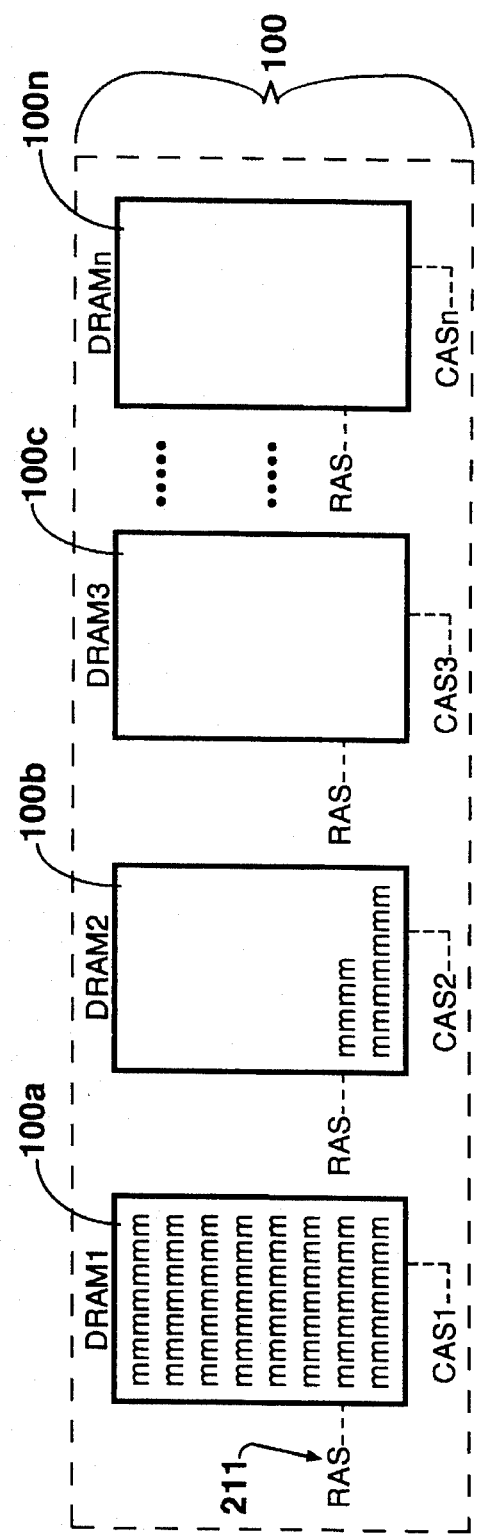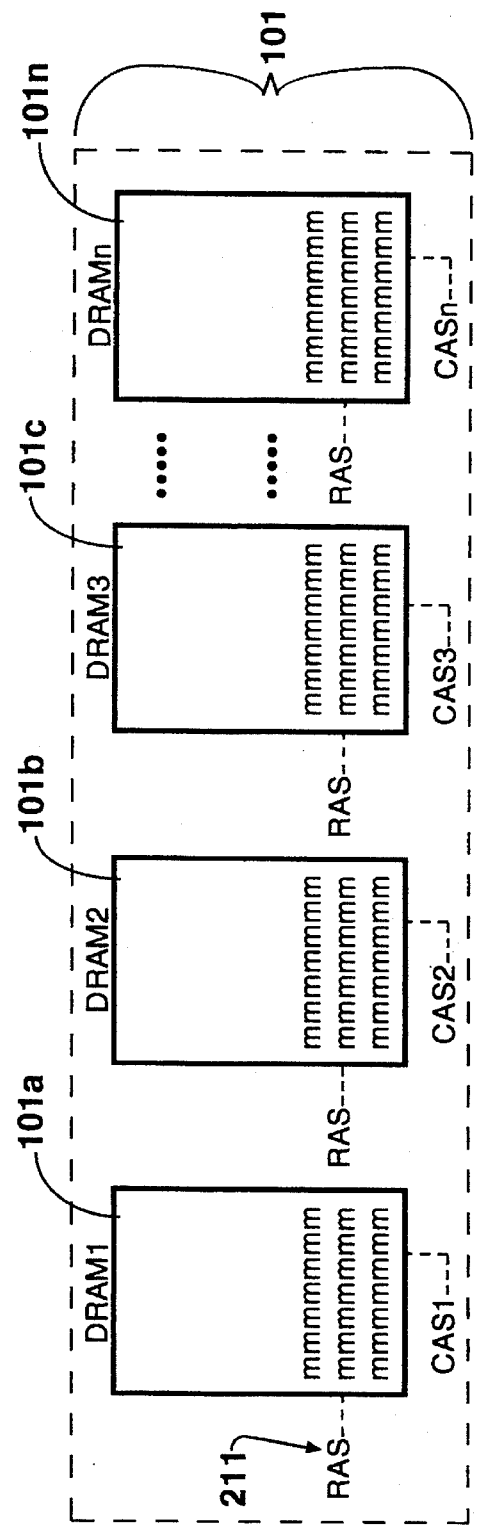
Fig. 1A. (Prior Art)
Fig. 1B.

TECHNIQUE FOR ACCESSING AND REFRESHING MEMORY LOCATIONS WITHIN ELECTRONIC STORAGE DEVICES WHICH NEED TO BE REFRESHED WITH MINIMUM POWER CONSUMPTION

FIELD OF THE INVENTION

The present invention relates broadly to the field of digital data storage and retrieval systems, and particularly to a circuit for accessing and refreshing memory locations within a plurality of electronic storage devices which need to be refreshed with minimum power consumption.

BACKGROUND OF THE INVENTION

As the technology of electronic digital storage devices improves, the application of such devices to everyday uses has greatly increased. One such application is a circuit using digital electronic storage devices to function as a digital telephone answering device (DTAD). Many of today's digital telephone answering devices use dynamic ram (DRAM) or audio ram (ARAM) as the electronic storage medium for storing data associated with DTAD systems. One characteristic of these types of electronic storage devices is that the memory locations containing data within these devices continually needs to be refreshed. If these memory locations are not refreshed within a given amount of time, the data contained within these memory locations will be lost.

An important feature of the DTAD relates to its power consumption during a power failure, when the DTAD is operating from battery power. In this mode of operation, the primary objective of the DTAD is to prevent the loss of messages stored in the DRAM memory devices. To achieve this objective, the DTAD must reduce its power consumption in order to extend the life of the battery, which is the only source of power available at that time. Thus, to reduce the power consumption of the DTAD while operating from battery power, the only functions which are active are those which continually refresh the data stored within the DRAM memory devices. As a result, nearly all of the battery power consumed during a power failure goes to refreshing the DRAM memory devices.

However, a common problem of the DTAD is its loss of data due to an extended power failure. This loss of data occurs as a result of the battery life of the battery expiring. The loss of battery life is in turn due to the amount of battery power required to refresh the DRAM memory devices. As stated previously, nearly all of the battery power consumed during a power failure goes to refreshing the DRAM memory devices. The power consumed during these refresh operations depends upon the number of memory locations which need to be refreshed, and upon how often these memory locations need to be refreshed.

In a conventional DTAD, a plurality of DRAMs are grouped together to form a large memory block wherein the message data is stored. This block of DRAMS is referred to as a DRAM memory structure. Within each DRAM is an array of memory locations organized by rows and columns. During the refresh operation, all memory locations having the same row address in each of the DRAMs are refreshed simultaneously. The refresh operation commences refreshing at the row with the lowest row address in each of the DRAMs, and continues refreshing, row-by-row, each succeeding row in each of the DRAMs simultaneously until the row with the highest address in each of the DRAMs has been refreshed.

This systematic procedure results in the refreshing of every memory location within each of the DRAMs regardless of whether these memory locations contain or do not contain data. If 100% of the DRAM memory structure is filled with data, then this refreshing scheme is an efficient way of refreshing the data contained within the DRAMs. However, this is not usually the case. Typically the DRAM memory structure of a DTAD is 10%–25% filled to capacity, which means that the refreshing scheme described above will needlessly consume excess power to refresh memory locations which contain no data. During a power failure, the refreshing of memory locations which contain no data results in the unnecessary waste of battery power, thereby reducing the battery life of the battery.

Thus, the power consumption of digital telephone answering devices has not proved to be as efficient as desired, particularly during extended power failures where an extended battery life time is critical to the preservation of messages stored within the devices' electronic memory structures. It is therefore an objective of the present invention to reduce the power consumption of conventional digital telephone answering devices.

SUMMARY OF THE INVENTION

This and additional objectives are accomplished by the various aspects of the present invention, wherein, briefly, according to a principle aspect, memory locations within the DRAM memory structure are accessed row by row, starting with the lowest row address, in a consecutive manner such that all memory locations having the same row address within each of the DRAMs are accessed before a memory location with a higher row address within any of the DRAMs is accessed. The result of accessing memory locations in this manner is that data is written to or read from the lowest rows of each DRAM within the DRAM memory structure before a next higher row within the DRAM memory structure is written to or read from. Once data is written to the memory locations within the DRAM memory structure in this fashion, the present invention is then able to reduce the number of refresh cycles needed to preserve the data within the DRAM memory structure by refreshing only those rows within the structures that contain data. This reduction in the number of refresh cycles results in a lower power consumption of the device, thereby extending the battery life of the device during a power failure. Contemporary DTADs are not able to implement such a reduction in the number of refresh cycles.

To implement this principle aspect of the invention, a new address decoder is used which defines and address word differently than that of conventional address decoders used in current DTADs. The address decoder of the present invention uses a consecutive number of least significant bits of the address word to define a column address of the memory location to be accessed; a consecutive number of least significant bits following the column address to define the specific DRAM to be selected; and a consecutive number of most significant bits to define the row address of the specific memory location to be accessed. This new architecture results in the accessing of memory locations in the manner described above, namely, that the lowest rows of every DRAM within the memory structure are accessed before a next higher row within the structure is accessed. The present invention also incorporates the use of a refresh address end register which is not contained in conventional DTADs. This register contains the row address of the highest row within the memory structure which contains data, and therefore defines the range of memory locations within the memory structure which need to be refreshed. When message data is being written into the memory structure, the refresh address end register is continually updated so that it will contain the row address of the highest row within the structure that contains data. A new refresh algorithm is also incorporated into the present invention, whereby the only rows that are refreshed are those between and including the lowest row address within the memory structure and the row address contained within the refresh address end register. This new algorithm maximizes the efficiency of the power used to refresh data within the memory structure since every row within this range is completely filled with data, with the exception of the highest row which may be partially filled with data.

In a preferred implementation, the present invention is directed to a circuit comprising a CPU, a DRAM interface, and a plurality of DRAMs which make up the memory structure of the DTAD. The DRAM interface controls the accessing operations of the memory locations within the memory structure. Included within the DRAM interface is the newly designed address decoder, the refresh address end register, and a refresh control circuit which implements the new refresh algorithm discussed above.

Additional objects, features and advantages of the various aspects of the present invention will become apparent from the following description of its preferred embodiment, which description should be taken in conjunction with the accompanying drawings.

BRIEF DESCRIPTION OF THE DRAWINGS

FIG. 1A is an illustration of data stored within a DRAM memory structure of contemporary digital telephone answering devices.

FIG. 1B is an illustration of data stored within the DRAM memory structure of the present invention.

DESCRIPTION OF THE PREFERRED EMBODIMENTS

Figure 2:
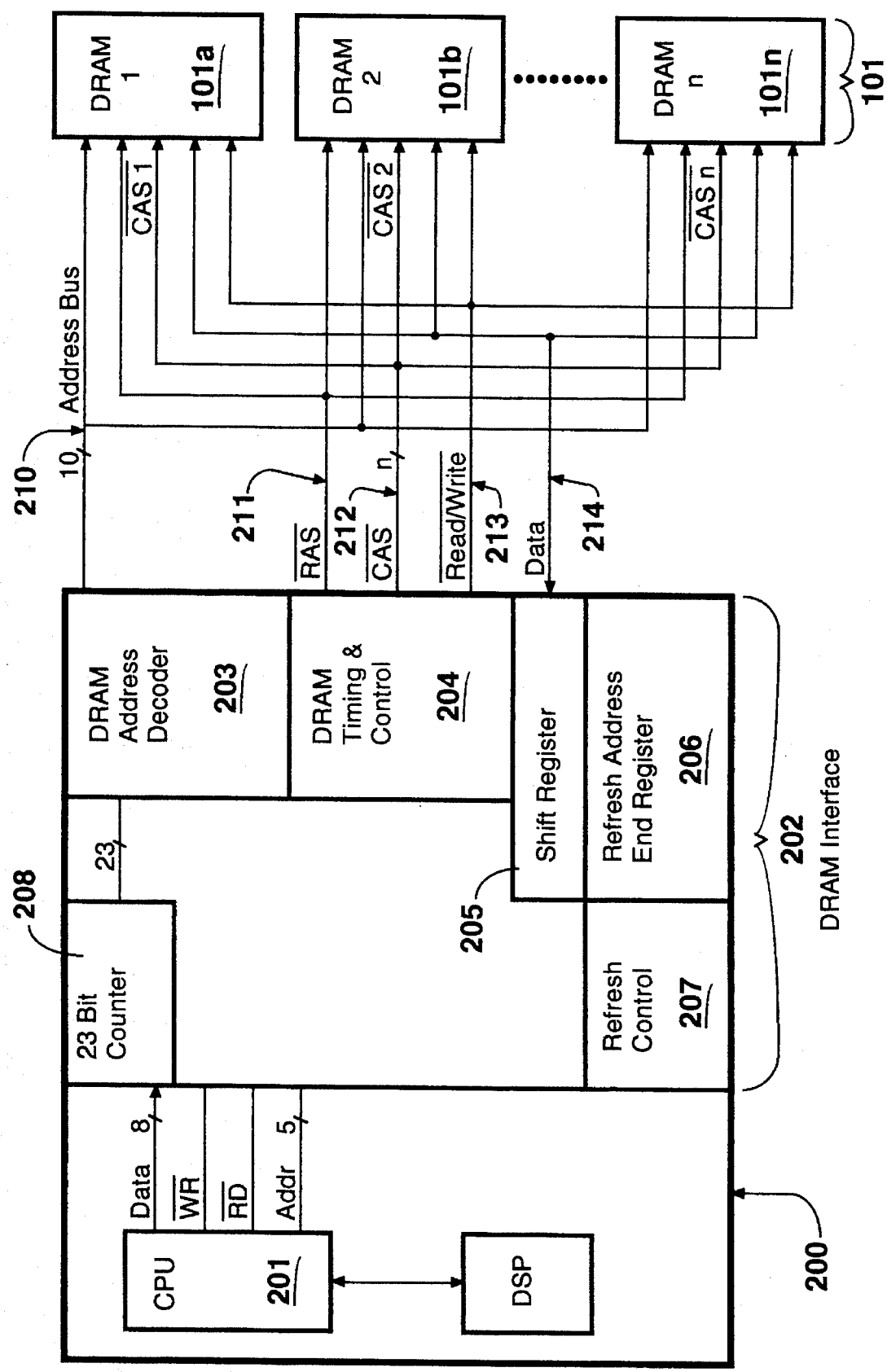
FIG. 2 is a diagram of the present invention as incorporated into a newly designed digital telephone answering device.

Referring first to FIG. 2, a digital telephone answering device is described with the various elements therein disclosed. The device consists of a DTAD chip 200 connected to a DRAM memory structure 101. The functional workings of a DTAD are known to those skilled in the art and therefore need not be described in detail in the present application. Included within the DTAD chip 200 is a CPU 201 and a DRAM interface 202. The CPU 201 communicates with its DRAM interface 202 instructing the DRAM interact to write data to or to read data from the DRAM memory structure 101, which is comprised of a plurality of DRAMs 101a, 101b, through 101n. Each of the plurality of DRAMs has a designated address and an array of memory locations, and each of the memory locations is defined by a row address and a column address. The DRAM interface 202 provides means for controlling the accessing operations of the memory locations within the DRAM memory structure 101.

Included within the DRAM interface 202 are the newly designed address decoder 203, the refresh address end register 206, a DRAM timing and control circuit 204, and a refresh control circuit 207 which implements the new refresh algorithm described in the present application. The address decoder 203 provides means for accessing memory locations row by row, starting with the lowest row address, in a consecutive manner such that all memory locations having the same row address within each of the plurality of DRAMs 101 are accessed before a memory location with a higher row address within any of the plurality of DRAMs 101 is accessed. A more detailed discussion of the address decoder architecture is discussed below. The refresh address end register 206 contains the row address of the highest row within the memory structure 101 that contains data. The refresh address end register is utilized by the DTAD in two ways. First, the DRAM interface 202 accesses the refresh address end register 206 while the DRAM interface 202 is writing data to the memory structure 101, and places into the register 206 the row address of the highest row that contains data within the memory structure 101. Second, during refresh operations, the row address contained within the refresh address end register 206 is used by the refresh control circuit 207 to determine the range of memory locations within the memory structure 101 which need to be refreshed. These refresh operations are discussed below in greater detail (see description of FIG. 4).

As depicted in FIG. 2, the DRAM memory structure 101 is comprised of a plurality of DRAMs 101a, 101b, 101n, which are tied together by common address lines, data lines, and control lines to form one large memory structure. In a specific embodiment 8 DRAMs are used to form the plurality of DRAMs 101a–n, each DRAM capable of storing one meg of data. In total, the memory structure would be capable of storing 8 meg of data, which is approximately 15 minutes of recorded messages. Attached to each DRAM 101a–n is an address bus 210, a data line 214, a read/write control signal 213, a common row address strobe line (RAS) 211, and a column address strobe (CAS) bus 212 wherein each specific DRAM 101a–n has a separate and specific column address strobe line attached to it. These strobe lines are indicated in FIG. 2 as CAS1, CAS2, and CASn.

Figure 3A:
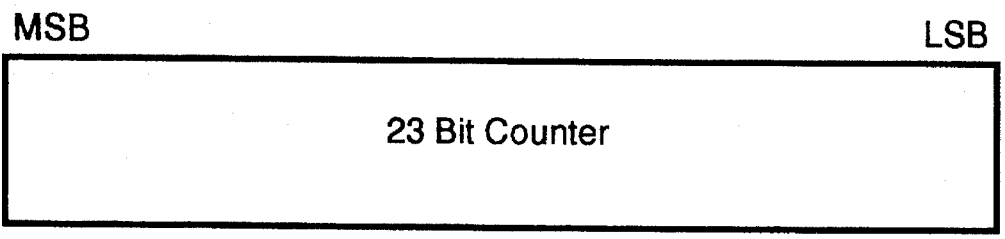
FIG. 3A shows an address word containing 23 bits, which comprises a least significant bit and a most significant bit.
Figure 3B:
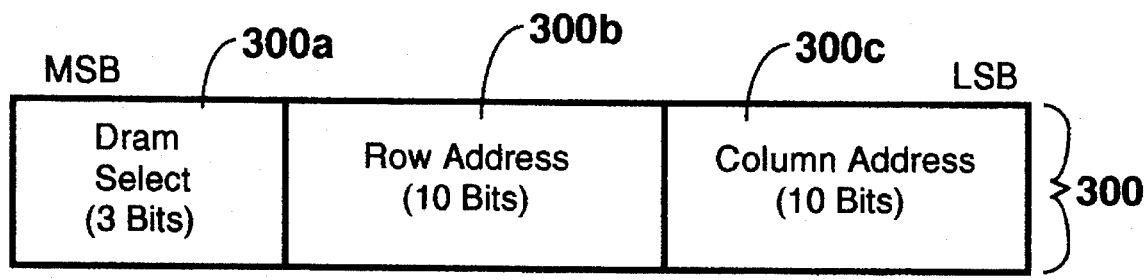
FIG. 3B illustrates how conventional address decoders within digital telephone answering devices define various parts of the address word.

A new technique for accessing memory locations as disclosed in the present application is accomplished through the use of a new address decoder architecture which defines an address word differently than that of conventional address decoders used in current DTADs. FIG. 3A shows a binary address word consisting of 23 bits, wherein the right most bit is defined as the least significant bit and the left most bit is defined as the most significant bit. The address word is generated from a 23-bit binary counter 208 (in FIG. 2) included within the DRAM interface 202. The conventional DTAD address decoder as illustrated in FIG. 3B breaks the address word of FIG. 3A down into three parts. The first part consisting of a consecutive number of most significant bits defines the address of a specific DRAM within the memory structure which is to be accessed, and is represented by Item 300A in FIG. 3B. The second part consisting of a consecutive number of middle bits immediately following the DRAM select address 300A defines the row address of the memory location within the specific DRAM which is to be accessed, and is represented by Item 300B in FIG. 3B. The third part consisting of a consecutive number of least significant bits defines the column address of the memory location within the specific DRAM chosen which is to be accessed, and is represented by Item 300C in FIG. 3B. All three parts together make up the binary address word 300 which in turn defines a specific memory location within a specific DRAM within the memory structure of the DTAD which is to be accessed.

Figure 3C:
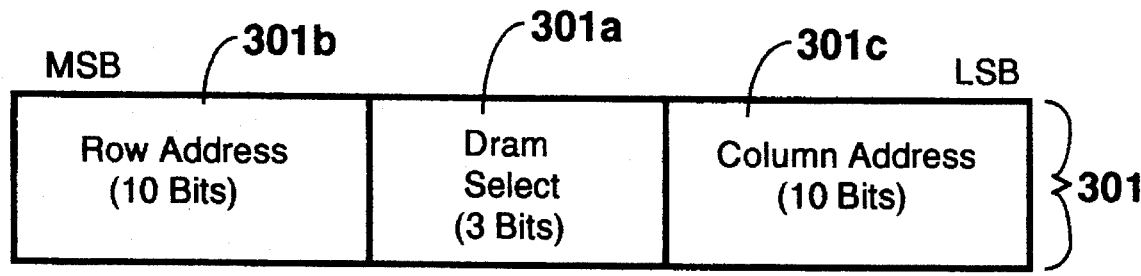
FIG. 3C illustrates how the newly designed address decoder of the present invention defines the various parts of the address word.

The new architecture of the address decoder of the present invention as depicted in FIG. 3C switches the locations of the address word which define the row address and the DRAM select. The address decoder of the present invention uses a consecutive number of least significant bits to define a column address of the memory location to accessed, and is represented by item 301C in FIG. 3C. A consecutive number of least significant bits following the column address now defines the specific DRAM to be selected, as represented by Item 301A in FIG. 3C, and a consecutive number of most significant bits now defines the row address of the specific memory location within the DRAM to be accessed, as represented by Item 301B in FIG. 3C. By switching the locations which define the row address 301B and the DRAM select 301A memory locations within the DRAM memory structure are able to be accessed in the manner described above, namely, that every memory location having the same row address within each of the DRAMs is accessed before a memory location with a higher row address within any of the DRAMs is accessed. This new accessing scheme occurs because the 23 bit address word is generated from a 23 bit counter 208, as depicted in FIGS. 2 and 3A.

As the counter is counting, it is continually changing the column address of the memory location to be accessed. This column address is defined in FIGS. 3B and 3C as the 10 least most significant bits 300C, 301C, respectively. In the prior art, after all 10 bits have been utilized in the counting process, the counter then spills over into the 11th bit which changes and increases the row address of the specific DRAM which is being accessed. The counting process continues, filling up each column within the new row address, until all combinations of rows and columns have been filled. After all 20 bits have been used in the counting process (e.g., row and column address bits 0–19 in FIG. 3B), every memory location within that specific DRAM has been accessed. It is only then, when the counter spills into the 21st bit, that a new DRAM selected to be accessed. In the new address decode architecture of the present invention, however, once the counter has gone through the first 10 bits, it then spills into the 11th bit which changes the specific DRAM being accessed. The result is that data is then written to consecutive column addresses in a new DRAM along the same row address as the previous DRAM. Another way of stating this accessing scheme is that every memory location having the same row address within each of the DRAMs is accessed before a memory location with a higher row address within any of the DRAMs is accessed.

An illustration of the accessing technique of the present invention compared with that of prior art is illustrated in FIGS. 1A and 1B. FIG. 1A depicts a DRAM memory structure 100 consisting of a plurality of DRAMs 100a, 100b, 100c and 100n. The accessing technique employed by conventional DTADs writes data to every memory location within a particular DRAM before moving on to a next DRAM. In FIG. 1A it can be seen that DRAM 100a is completely filled with data which is symbolized by the smaller case m's. Since the DRAM 100a is completely filled, the unit then begins storing data in DRAM 100b until every memory location within DRAM 100b is filled, whereupon the device will then access DRAM 100c. This accessing technique is based upon the address decode architecture of FIG. 3B.

FIG. 1B depicts the new accessing technique of the present invention according to the new address decode architecture depicted in FIG. 3C. FIG. 1B shows a DRAM memory structure 101 comprised of a plurality of DRAMs 101a, 101b, 101c and 101n. Rather than writing to a specific DRAM until it is filled, the new accessing technique as depicted in FIG. 1B treats the DRAM memory structure 101 as a single structure wherein the lowest rows of the structure are accessed before any subsequent higher row is accessed. Thus, as illustrated in FIG. 1B once the DTAD has accessed and stored data in all the memory locations of the lowest row in DRAM 101a, it then accesses and begins to write data to the lowest row in DRAM 101b until all memory locations along that row have been written to, whereupon it then accesses and writes data to the lowest row in DRAM 101c until that row is filled. After all memory locations along the bottom row of each DRAM have been accessed and written to, the device then begins to access and write data in the same manner as before along the next higher row within each of the DRAMs 101a–n. It should be noted that although the current accessing technique has been described in terms of writing data, it is similarly applied to reading data from the memory locations within the DRAM memory structure 101. In other words, the accessing technique for reading data in the present invention is the same as the accessing technique for writing data in the present invention.

Simultaneously, while writing data to memory locations within the memory structure 101, the DRAM interface 202 continually updates the refresh address end register 206 with the highest row address that contains data within the memory structure 101. As illustrated in FIG. 1B, it can be seen that the first two rows of the structure 101 have been filled with data, and that the next row, row 3 is currently being filled with data. Therefore, in this example the DRAM interface 202 would write the row address of row 3 into the refresh address end register 206. Once row 3 is completed and the device begins to write to row 4, the DRAM interface 202 will update the refresh address end register 206, writing into it the row address of row 4.

The new accessing technique, new address decode architecture, and the refresh address end register are all integral parts of the technique of the present invention to reduce the power consumption of digital telephone answering devices which use electronic memory devices such as DRAMs that need to be refreshed. In addition, each of the aforementioned elements can be incorporated into a single integrated circuit chip. These elements are important because they enable the refresh operation of the DTAD to refresh only those rows within the memory structure 101 which contain data. Since only those rows within the structure 101 which contain data are refreshed, the power consumption of the device is accordingly reduced.

One of the benefits of the new address decode architecture is that it is transparent to the user. The end user or programmer using the present invention need not know of the new address decode architecture or account for it in his or her programming. Therefore, all existing software and hardware for conventional DTADs is compatible with the new address decode architecture disclosed in the present application. For example, when messages are deleted in conventional DTADs, a compacting algorithm re-locates data storred within the memory structure so that there are no breaks in the continuity of memory locations that contain data. Since the new address decode architecture of the present invention is transparant to the user, the compacting algorithm used in conventional DTADs will also work in the present invention without any modification, and will access memory locations within the memory structure 101 in the same manner as depicted in FIG. 1B.

Figure 4:
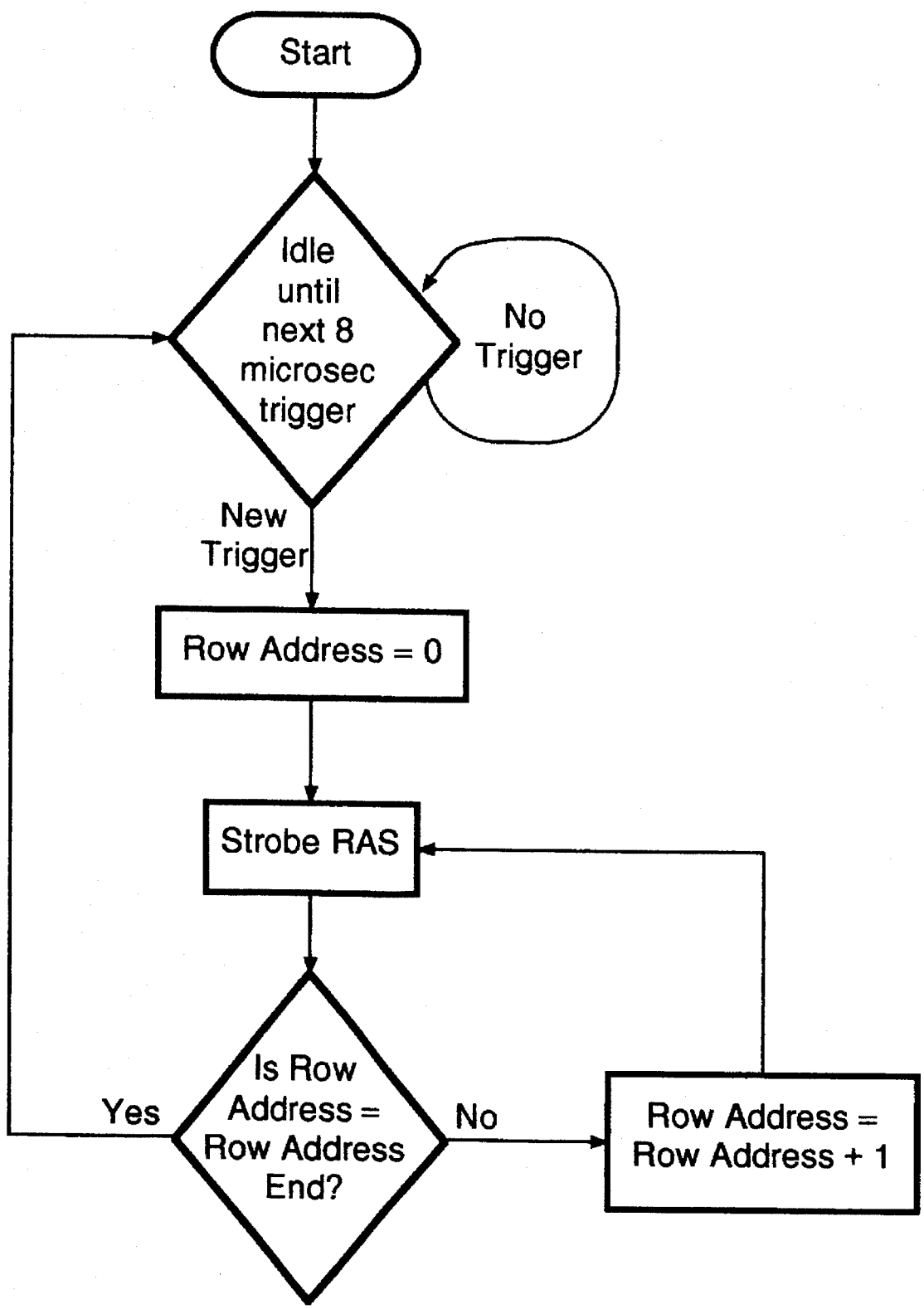
FIG. 4 is a diagram of the refresh algorithm of the present invention.

The reduction in power consumption of the present invention is achieved through the implementation of a new refresh algorithm as depicted in FIG. 4. Because of the nature of the DRAM, data contained within the memory locations within the DRAM must continually be refreshed or the data will be lost. The technique for refreshing the data within the structure 101 essentially comprises the steps of refreshing all the memory locations between and including the lowest row address within the structure 101 and the row address contained in the refresh address end register 206. Many conventional DTADs are designed to refresh the data contained within the memory structure 100 as often as possible. These devices consume relatively large amounts of power to carry out their refresh operations in comparison to the power consumption of the present invention to carry out its refresh operations. Specifically referring to FIG. 4, for example, the refreshing technique of the present invention comprises the steps of waiting for a trigger signal from a source wherein such a signal indicates the need to refresh memory locations within the memory structure 101. The trigger signal of the present invention is controlled by the refresh control 207, and usually occurs approximately every 8 milliseconds. However, the timing of this trigger signal can be changed to accommodate differing specifications of different DRAMs used in the memory structure 101. This change can be implemented using software to program the refresh control circuit 207. Upon receiving a trigger signal which indicates the need to refresh memory locations within the memory structure 101, the DRAM interface 202 sets the address pointer of the row address strobe 211 to 0, which is the lowest row address in the memory structure 101. The interface 202 then pulses the row address strobe 211 which then simultaneously refreshes every memory location located on the bottom row of every DRAM 101a–n within the memory structure 101. After the row address strobe has been pulsed, the device then compares the row address pointer of the row address strobe to the address located in the refresh address end register. If the address of the pointer of the row address strobe is not equal to the address contained within the refresh address end register, this indicates that an additional row of memory locations needs to be refreshed. At this point, the address of the pointer of the row address strobe in incremented by 1 so that the row address strobe now points to the second row of memory locations within the structure 101. This is illustrated in FIG. 1B. In FIG. 1B it can be seen that the row address strobe 211 is tied to each DRAM within the memory structure 101. By pulsing the row address strobe 211, every memory location on the second row within the memory structure 101 is refreshed simultaneously. After the second row of data has been refreshed, the values of the address pointer and the refresh address end register 206 are again compared. If the values are not equal, the address pointer is again incremented by 1, and the refreshing technique continues until the address of the row address strobe pointer is equal to the address contained within the refresh address end register. In other words, until every row containing data within the memory structure 101 has been refreshed. Once the two addresses are equal, this indicates that the most recently refreshed row is the last row within the memory structure 101 containing data, and that no more rows need to be refreshed. At this point, the refresh operation will sit idle until it receives another trigger signal to indicate the need for another refresh operation.

The new accessing technique, new address decode architecture, refresh address end register, and new refreshing technique are integral parts of the technique of the present invention to reduce the power consumption of electronic devices which use electronic memory devices such as DRAMs that need to be refreshed. In addition, each of the aforementioned elements can be incorporated into a single integrated circuit chip. Such electronic devices could be digital telephone answering devices, fax machines, or computers. This technique is particularly useful in devices which rely on battery powered backup to prevent the loss of digital information stored within the electronic memory devices that need to be refreshed. The reduction in power consumption of the present invention compared to that of the prior art, is due to the fact that conventional DTADs refresh every memory location within the DRAM memory structure 100 regardless of whether or not those memory locations contain data. During a power failure this needless refreshing to memory locations which contains no data results in the unnecessary waste of battery power, thereby reducing the battery life of the battery. However the present invention reduces the power consumption of the DTAD by combining the aforementioned elements of the present invention. This reduction in power consumption is particularly important during extended power failures where a prolonged battery life is critical to the preservation of data stored within the memory structure 101. By accessing memory locations having the same row address within the memory structure 101, data can be written to and stored in the memory structure 101 so as to fill all memory locations within a particular row within every DRAM before a next higher row is accessed. This is depicted in FIG. 1b. The refreshing circuit then refreshes only those rows within the memory structure 101 which contain data or a portion of data, starting with the lowest row address and ending with the row address contained in the refresh address end register 206. Thus, if the memory structure 101 is only 10 percent filled with data, then only 10 percent of the memory structure 101 will be refreshed. During a power failure this results in a 90 percent reduction in power consumption over conventional DTADs, which would refresh the entire memory structure regardless of the percentage of the structure which is filled with data. Conventional DTADs were designed this way because it was usually the case that at least one of the DRAMs in a memory structure 100 would be completely filled with data since data is written to fill each DRAM completely before preceding to a next DRAM. In addition, because of space consideration, the row address strobe is designed to refresh every memory location within the data structure 100 simultaneously; it cannot merely refresh one DRAM at a time. Because of these limitations refreshing techniques contained within the prior art consumed excess power to refresh memory locations within the memory structure 100 which contained no data. The present invention, however, optimizes this storage and refreshing of data contained within the memory structure 101, accounting for the physical limitations of the row address strobe and other components of the digital telephone answering device. Compared with conventional DTAD refreshing techniques, the technique of the current invention can significantly reduce the power consumption of the DTAD during refresh operations depending on the amount of data stored in the memory structure. This reduction in power consumption allows for an extended battery life when the DTAD is operating exclusively from battery power.

The description of the preferred embodiment of this invention is given for purposes of explaining the principles thereof, and is not to be considered as limiting or restricting the invention since many modifications may be made by the exercise of skill in the art without departing from the scope of the invention.

What is claimed:

1. A circuit for accessing memory locations in a plurality of dynamically refreshed electronic memory devices, each of said devices having a designated address and an array of memory locations, each of said locations defined by a row address and column address, said circuit comprising:

a CPU;

a single row address strobe line connected in parallel to each of said plurality of memory devices; and controlling means connecting said CPU to said plurality of devices for controlling the accessing operations of memory locations within said plurality of devices, said controlling means including means for accessing memory locations row-by-row, starting with a lowest row address, in a consecutive manner such that all memory locations having the same row address within each of said plurality of devices are accessed before a memory location with a higher row address within any of said plurality of devices is accessed.

2. The circuit of claim 1 wherein said controlling means further comprises means including a single refresh address end register for storing a highest row address containing data within any of said plurality of devices.

3. The circuit of claim 2 that further comprises:

means connected to said storing means and said controlling means for accessing said register by said controlling means at least once during a portion of the accessing operations, and means connected to said storing means and said controlling means for writing into said register the highest row address containing data within any of said plurality of devices, wherein said register includes means for storing row address information and is devoid of means for storing column address information.

4. The circuit of claim 1 wherein said CPU and said controlling means are part of a single semiconductor chip.

5. The circuit of claim 1 wherein said accessing means includes:

(a) a device-selecting means for selecting a specific electronic memory device from said plurality of devices based on a consecutive number of middle bits of a binary word having a least significant bit and a most significant bit;

(b) row-selecting means for selecting a specific row address of said selected device based on a consecutive number of most significant bits of said binary word; and (c) a column-selecting means for selecting a specific column address of said selected device based on a consecutive number of least significant bits of said binary word.

6. A circuit for refreshing a desired range of memory locations in a plurality of electronic memory devices, each of said plurality of devices having a designated address and an array of memory locations, each of said memory locations being defined by a row address and column address, said desired range of memory locations having a lowest row address and a highest row address, said circuit comprising:

a CPU;

a single row address strobe line connected in parallel to each of said plurality of memory devices for simultaneously refreshing an entire row of memory locations within each of said memory devices; and controlling means connecting said CPU to said plurality of devices for controlling the refreshing operation of memory locations within said plurality of devices, said controlling means including means for accessing said memory locations, said controlling means further including means for refreshing only said desired range of memory locations.

7. The circuit of claim 6 wherein said controlling means includes means for accessing said memory locations, and includes a single refresh address end register wherein said register contains a row address of a last row of memory locations within said plurality of devices which need to be refreshed;

said controlling means further comprising means for accessing said refresh address end register at least once during the refresh operations.

8. The circuit of claim 6 wherein said CPU, said accessing means and said refresh address end register are part of a single semiconductor chip.

9. A circuit for addressing memory locations in a plurality of electronic memory devices which need to be refreshed, comprising:

a binary counter for defining a continuous address word, said address word including:

a device address portion for selecting a specific electronic memory device from said plurality of devices;

a column address portion for selecting a specific column address of said selected device; and a row address portion for selecting a specific row address of said selected device;

said counter comprising a plurality of subcounters including:

a device-selecting subcounter for defining said device address portion of said binary address word;

a row-selecting subcounter for defining said row address portion of said binary address word; and a column-selecting subcounter for defining said column address portion of said binary address word;

said subcounters being arranged in a continuous, sequential manner such that, when said column-selecting subcounter reaches a first predetermined value, a least significant bit of said device-selecting subcounter is caused to toggle; and when said device-selecting subcounter reaches a second predetermined value, a least significant bit of said row-selecting subcounter is caused to toggle.

10. A method for refreshing a desired range of memory locations located in a plurality of electronic memory devices which need to be refreshed, each of said plurality of devices having a designated address and an array of memory locations, each of said locations defined by a row address and a column address, said desired range of memory locations having a lowest row address and a highest row address, said method comprising refreshing only said memory locations within said desired range, said refreshing step including the step of simultaneously refreshing an entire row of memory locations within each of said memory devices, wherein said entire row of memory locations within each of said memory devices is caused to be simultaneously refreshed by a commonly shared row address strobe signal.

11. The method of claim 10 wherein said plurality of memory devices are connected in parallel to a single row address strobe line, and wherein said simultaneous memory location refreshing step includes the step of strobing said row address strobe line to thereby simultaneously refresh said entire row of memory locations within each of said plurality of memory devices.

12. A method for refreshing memory locations located in a plurality of electronic memory devices which need to be refreshed, each of said plurality of devices connected via an address bus to a controller comprising a refresh address end register, each of said plurality of devices also connected in parallel to the controller via a single, common refresh row address line, and each of said plurality of devices having a designated address and an array of memory locations, each of said locations defined by a row address and a column address, said method comprising the steps of:

(a) waiting for a signal from a source, wherein said signal indicates the need to refresh memory locations within said plurality of devices;

(b) thereafter receiving said signal from said source;

(c) thereafter setting a row address of the address bus to a first address;

(d) thereafter strobing the refresh row address line to thereby assert a row address strobe signal on said address line, wherein an entire row of memory locations having a row address equal to the row address of said address bus in each of said plurality of devices are all refreshed simultaneously as a result of receiving said row address strobe signal;

(e) thereafter comparing the row address of said address bus to the address located in the refresh address end register;

(f) thereafter returning to step (a) if the row address of said address bus is equal to the address located in said refresh address end register;

(g) thereafter incrementing the row address of the address bus by one;

(h) thereafter returning to step (d).

13. A method for reducing power consumption of a circuit comprising a plurality of electronic memory devices which need to be refreshed, each of said memory devices having a designated address and an array of memory locations, each of said memory locations defined by a row address and column address, said method comprising the steps of:

(a) accessing a desired range of memory locations in said plurality of memory devices row-by-row, starting with a lowest row address, in a consecutive manner such that all memory locations having a same row address within each of said plurality of devices are accessed before a memory location with a higher row address within any of said plurality of devices is accessed; and (b) refreshing only said desired range of memory locations within said plurality of memory devices which contain data to be refreshed, wherein said refreshing step includes the step of simultaneously refreshing an entire row of memory locations within each of said memory devices by asserting a single, common row address strobe signal to said entire row of memory locations within each of said memory devices.

14. The method of claim 13, said circuit including a controller comprising a refresh address end register, said register containing a row address of a last row of memory locations within said plurality of devices which need to be refreshed, wherein said refreshing step (b) further includes the step of refreshing all memory locations within said desired range between and including the lowest row address and the row address contained in the refresh end address register.

* * * * *